(12) United States Patent
Wetzel

(10) Patent No.: US 9,637,073 B2
(45) Date of Patent: May 2, 2017

(54) ENCAPSULATED CONTROL MODULE FOR A MOTOR VEHICLE

(75) Inventor: Gerhard Wetzel, Korntal-Muenchingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 738 days.

(21) Appl. No.: 13/703,928

(22) PCT Filed: May 19, 2011

(86) PCT No.: PCT/EP2011/058111
§ 371 (c)(1),
(2), (4) Date: Feb. 25, 2013

(87) PCT Pub. No.: WO2011/160897
PCT Pub. Date: Dec. 29, 2011

(65) Prior Publication Data
US 2013/0147267 A1    Jun. 13, 2013

(30) Foreign Application Priority Data

Jun. 25, 2010  (DE) .................. 10 2010 030 528

(51) Int. Cl.
| | | |
|---|---|---|
| *B60R 16/03* | (2006.01) | |
| *H01L 25/16* | (2006.01) | |
| *H01L 23/00* | (2006.01) | |
| *H05K 13/04* | (2006.01) | |

(52) U.S. Cl.
CPC .............. *B60R 16/03* (2013.01); *H01L 24/49* (2013.01); *H01L 25/16* (2013.01); *H01L 25/165* (2013.01); *H05K 13/0469* (2013.01); *H01L 2224/05553* (2013.01); *H01L 2224/4824* (2013.01); *H01L 2224/48472* (2013.01); *H01L 2224/49* (2013.01); *H01L 2924/00014* (2013.01); *H01L 2924/01029* (2013.01);
(Continued)

(58) Field of Classification Search
CPC ...... H05K 7/02; H01L 24/49; H01L 2924/181
See application file for complete search history.

(56) References Cited

U.S. PATENT DOCUMENTS 2,864,036 A * 12/1958 Steiner .................. H02H 7/226
                                                    361/107
4,764,804 A *  8/1988 Sahara et al. ................. 257/717
(Continued)

FOREIGN PATENT DOCUMENTS

DE          103 15 432      10/2004
DE     10 2007 032 142       1/2009
(Continued)

OTHER PUBLICATIONS

International Search Report, International Application No. PCT/EP2011/058111, dated Aug. 5, 2011.

*Primary Examiner* — Thienvu Tran
*Assistant Examiner* — Pinping Sun
(74) *Attorney, Agent, or Firm* — Gerard Messina

(57) ABSTRACT

A control module for a motor vehicle having a base plate and electronic modules situated thereon is described. The electronic modules are encapsulated and the insulating compound which protects against environmental influences and is used for this purpose is a distance away from the edge of the base plate over the entire circumference.

11 Claims, 5 Drawing Sheets

(52) U.S. Cl.
CPC .............. *H01L 2924/181* (2013.01); *H01L 2924/19107* (2013.01); *H01L 2924/351* (2013.01)

(56) References Cited

U.S. PATENT DOCUMENTS

| | | | | |
|---|---|---|---|---|
| 5,193,270 | A | * | 3/1993 | Stade ............... B60T 8/3675 29/840 |
| 6,398,903 | B1 | * | 6/2002 | Stedron et al. ............ 264/275 |
| 6,623,588 | B1 | * | 9/2003 | Rasmussen ............... 156/221 |
| 7,193,852 | B2 | * | 3/2007 | Wetzel ..................... 361/714 |
| 8,505,198 | B2 | * | 8/2013 | Schaaf ..................... 174/260 |
| 2006/0158804 | A1 | * | 7/2006 | Usui et al. ................. 361/58 |
| 2010/0170706 | A1 | | 7/2010 | Kimmich et al. |

FOREIGN PATENT DOCUMENTS

| | | | | |
|---|---|---|---|---|
| DE | 102007032142 A1 | * | 1/2009 | ............ H05K 7/02 |
| EP | 0 834 923 | | 4/1998 | |
| EP | 0834923 A1 | * | 8/1998 | ............ H01L 25/07 |
| EP | 1 396 885 | | 3/2004 | |
| JP | 2000-59013 | | 2/2000 | |
| JP | 2002-147888 | | 5/2002 | |
| JP | 2003-273287 | | 9/2003 | |
| JP | 2003-298001 | | 10/2003 | |
| JP | 2006-522575 | | 9/2006 | |
| WO | WO 2007036384 A2 | * | 4/2007 | ............ H05K 1/00 |
| WO | WO 2007-052476 | | 10/2007 | |
| WO | WO 2008155154 A1 | * | 12/2008 | ............ H05K 1/00 |
| WO | WO 2010052202 A1 | * | 5/2010 | ............ H05K 7/02 |

\* cited by examiner

ENCAPSULATED CONTROL MODULE FOR A MOTOR VEHICLE

FIELD

The present invention relates to control modules and methods for manufacturing same. The present invention relates in particular to a control module for a motor vehicle, a motor vehicle having a control module and a method for manufacturing a control module.

BACKGROUND INFORMATION

Control modules for automatic transmissions in motor vehicles are installed in the transmission in such a way that they are entirely or partially immersed in transmission oil. These control modules contain an electronic system which must be packed in an oil-tight housing, so that aggressive transmission oil does not destroy the electronic system. This seal must be ensured within the operating temperature of the vehicle's automatic transmission, i.e., in a temperature range from approximately −40° C. to +150° C.

There are various approaches for packing the electronic system. For example, hermetically sealed steel housings with glass-sheathed pins may be used for electrical contacting of the electronic system. Housings manufactured by a so-called molding operation may also be used.

Such a molded housing, i.e., sealed using an encapsulating resin, is described in European Patent No. EP 1 396 885 B1. An interconnect device is fitted with electronic components and then completely enclosed in the molding compound, electrical contacting of the interconnect device to the outside being accomplished through a punched screen. The individual contact strips of the punched screen emerge from the molded housing at the side faces. In the control module, these contact strips are welded to the punched screen of the control module and are then covered by plastic covers which contain ribs that pass between the contact strips to thereby achieve short-circuit protection.

All contact strips must have adhesion to the molding compound on all side faces to ensure the oil tightness of the mold housing. This adhesion depends on many parameters, e.g., the geometry and distribution of the contact strips. With a change in the contact strip configuration, it may therefore be necessary to adjust the process accordingly.

Forces are also exerted on the contact strips due to welding of the punched screen of the control module, so these forces may also result in crack formation and therefore leakage of the mold housing. In addition to the forces introduced mechanically, the situation is also similar for forces introduced through thermal stresses, e.g., because of different expansion coefficients.

In manufacturing the mold housing, the two mold halves of the molding tool move toward the punched screen and form a seal with it. This means that the interspaces between the individual contact strips would also have to be sealed by the two mold halves, which, however, is technically complicated due to parts tolerances. Alternatively, the webs may also be punched out after the molding operation to obtain electrical separation of the individual contact strips. This necessitates an additional process step which also entails the risk of damage to the mold housing due to crack formation.

German Patent No. DE 103 15 432 A1 describes a configuration for electrically connecting an electrical unit which is situated in the interior of a metal housing and has flexible foil conductors leading out of the housing.

SUMMARY

One object of the present invention is to provide a control module which is simple to manufacture and also provides reliable protection for the electronic modules. Another object of the present invention is to provide a method for manufacturing such a control module.

According to a first aspect of the present invention, an example control module for a motor vehicle is provided, having a base plate, an electrical unit, an electrically insulated feeder line and an insulating compound, which protects against environmental influences. The electrical unit has at least one electronic module and is situated on a top side of the base plate. The electrically insulated feeder line is used for electrically connecting the electronic module to an external electrical component and the insulating compound, which protects against environmental influences (this compound being an encapsulating resin, for example), is applied to the top side of the base plate and covers the electrical unit with a seal. This is, thus, an encapsulation. The base plate protrudes here beyond the protective compound in a planar extent along the entire circumference of the base plate. In other words, the base plate protrudes so that it has a larger base area than the protective compound.

According to another exemplary embodiment of the present invention, the protective compound is applied only to the top side of the base plate but not to the bottom side of the base plate. It is thus possible for the base plate to be accommodated by a lower half of a molding tool before applying the protective compound and for the corresponding upper half of the molding tool to be applied to the base plate with a seal, whereupon the protective compound is introduced into the molding tool.

According to another exemplary embodiment of the present invention, all electrical insulated feeder lines are mounted on the bottom side of the base plate opposite the protective compound. In other words, the electronic module(s) is (are) situated on the top side of the base plate, all feeder lines being situated on the bottom side of the base plate.

According to another exemplary embodiment of the present invention, the base plate has one or more openings beneath which the feeder line(s) is (are) situated. The openings are used for the feed-through of one or more electrical lines between the electronic module and the corresponding feeder line. The feeder line is situated on the bottom side of the base plate.

According to another aspect of the present invention, a motor vehicle having a control module as described above and below is provided.

According to another aspect of the present invention, a method is provided for manufacturing a control module as described above and below; in this method, a base plate having an electronic module is provided, a feeder line being mounted on the base plate and an insulating compound which protects against environmental influences being applied to the top side of the base plate, this compound tightly covering the electrical unit and the base plate protruding beyond the protective compound in a planar extent on the entire circumference.

According to another exemplary embodiment of the present invention, the compound is applied to the top side of the base plate by using a molding tool having a tool bottom part and a tool top part, the base plate being inserted into the tool bottom part when the protective compound is applied, and the tool top part being in contact on the top side of the base plate when the protective compound is applied along a circumferential sealing line.

BRIEF DESCRIPTION OF THE DRAWINGS

Exemplary embodiments of the present invention are described below with reference to the figures.

DETAILED DESCRIPTION OF EXAMPLE EMBODIMENTS

Figure 1:
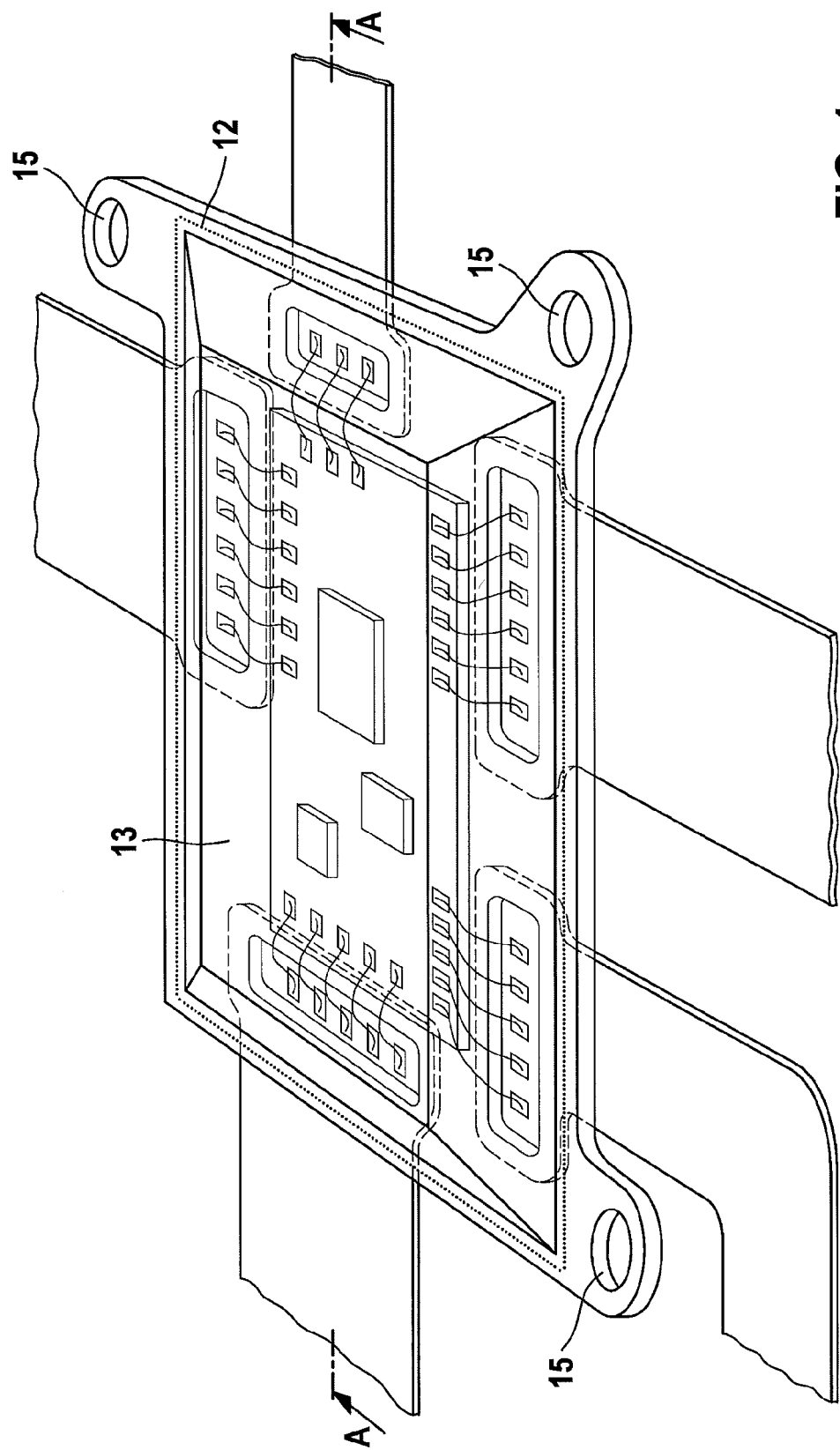
FIG. 1 shows an encapsulated control unit according to one exemplary embodiment of the present invention.

The diagrams in the figures are schematic and are not drawn to scale. In the following description of the figures, the same reference numerals are used for the same or similar elements.

FIG. 1 shows an encapsulated (i.e., sheathed) control module according to one exemplary embodiment of the present invention. This control module is, for example, a control module for an automatic transmission of a motor vehicle. Molding compound 13 is shown as transparent for the sake of clarity.

Figure 2:
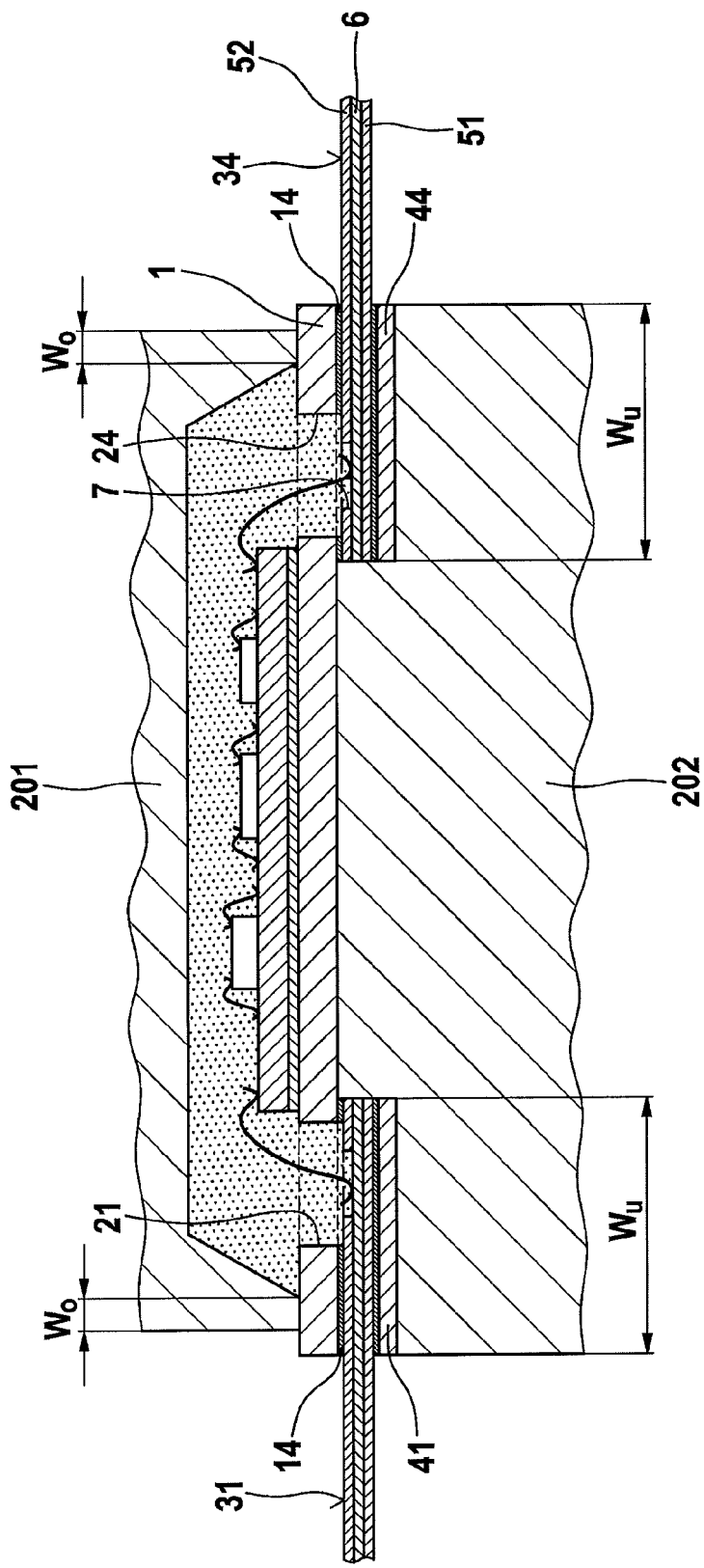
FIG. 2 shows a sectional diagram of the control module of FIG. 1, including a subarea of a molding tool.

FIG. 2 shows a section through the control module of FIG. 1, drawn as sectional line A-A in FIG. 1.

The control module (also referred to as a control unit) has a base plate 1 having an electrical contact, which may be created as a subassembly group. This module or construction stage is shown in FIG. 3.

Figure 4:
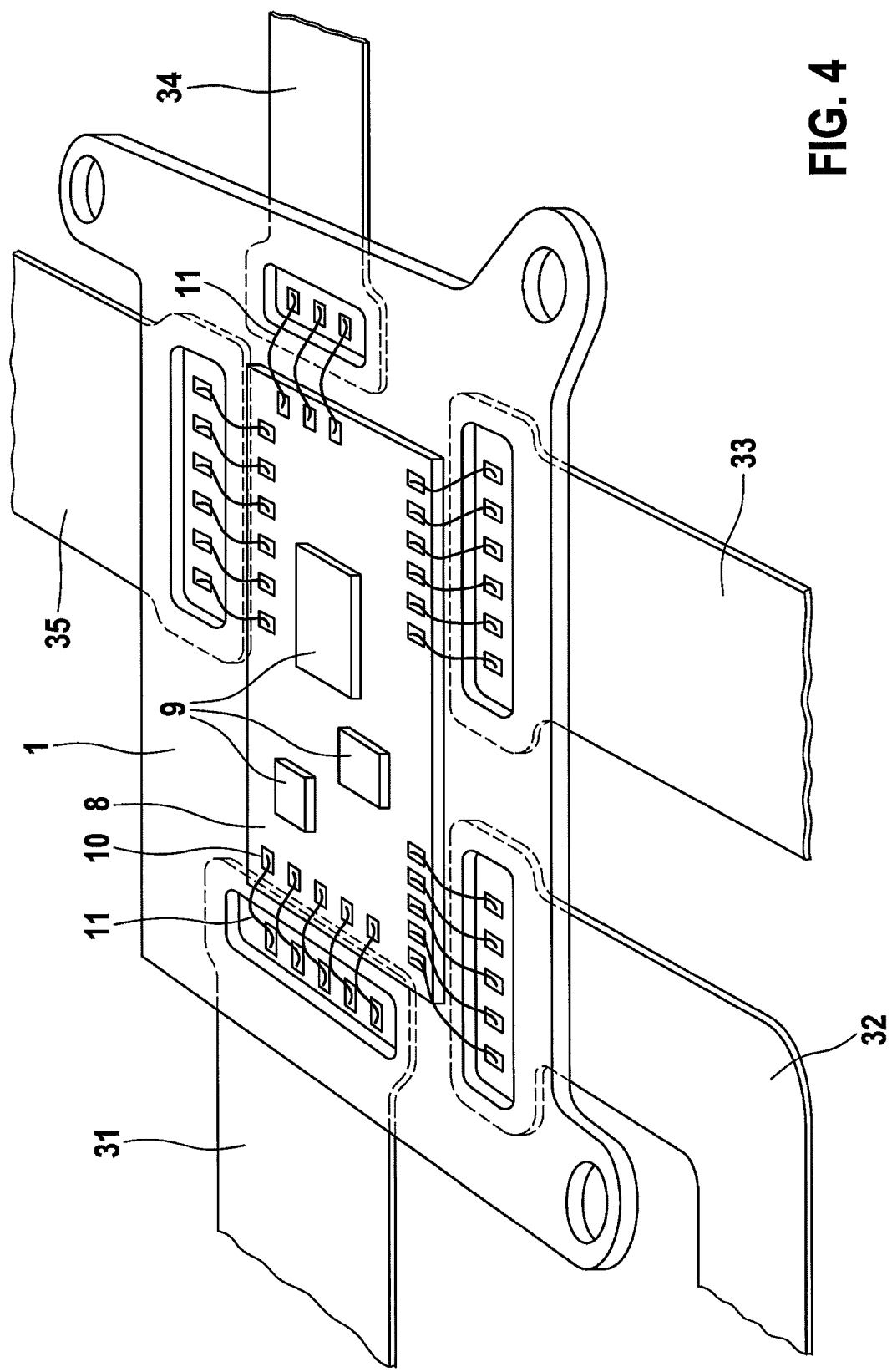
FIG. 4 shows another construction stage of the control module of FIG. 1.

The electronic circuit, which includes interconnect device 8 having at least one electronic component or an electronic module 9, is adhesively affixed or otherwise attached to base plate 1. This construction stage is illustrated in FIG. 4.

Figure 3:
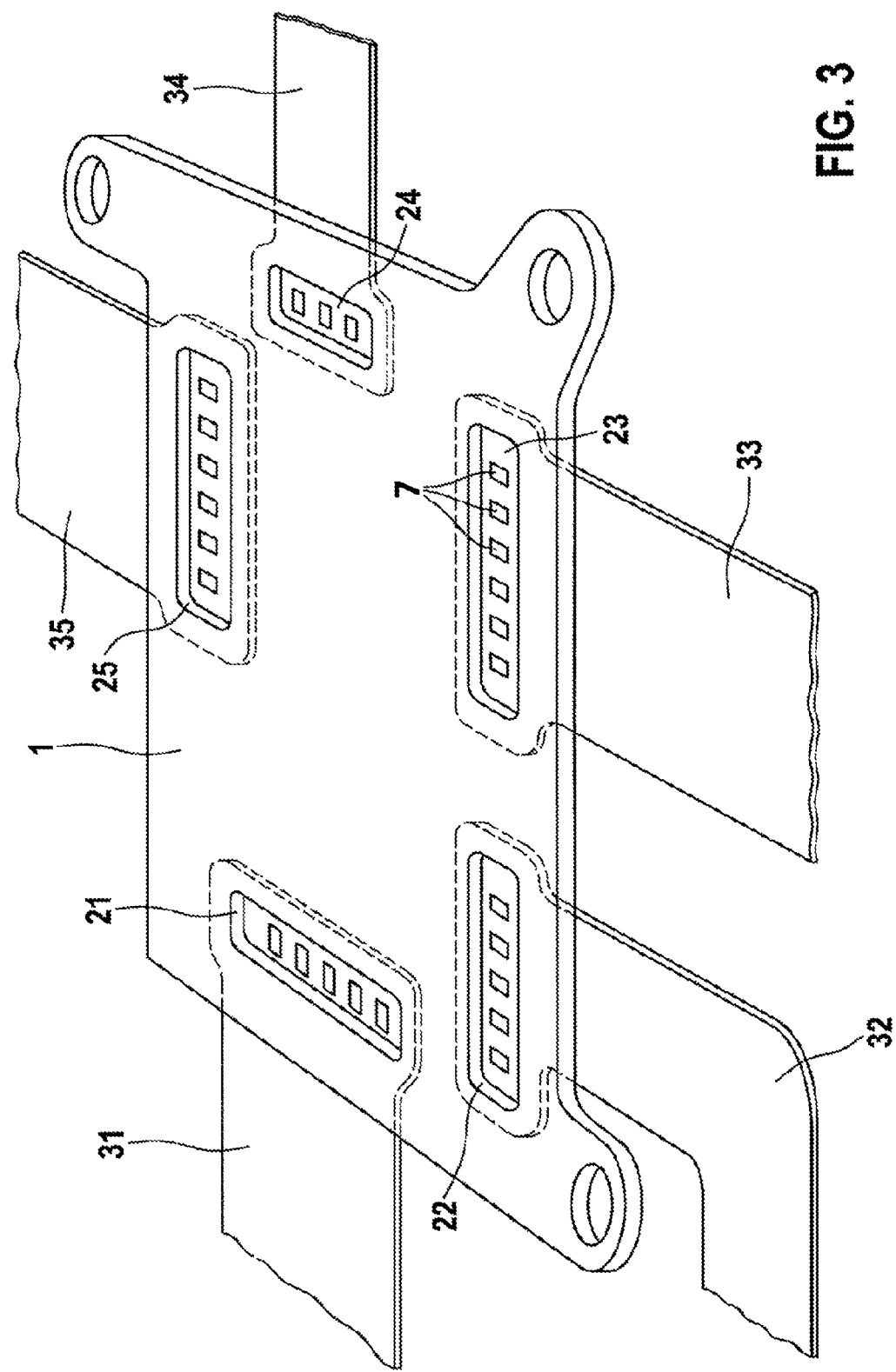
FIG. 3 shows a construction stage of the control module of FIG. 1.

The structure of the control module is described as follows, similar to the possible manufacturing sequence:

Flexible foil conductor elements (also referred to as flex foil elements) 31, 32, 33, 34, 35, preferably in strips, are each adhesively affixed to the bottom side of base plate 1, beneath corresponding openings 21, 22, 23, 24, 25 (see also FIG. 3 and the sectional diagram in FIG. 2). The adhesive bonding of foil conductor elements 31 through 35 to base plate 1 seals openings 21 through 25 at the bottom. Each foil conductor element is provided with a planar stiffening element 41, 42, 43, 44 on the side opposite openings 21 through 24 (see FIG. 2).

For example, the reinforcing or stiffening element is an adhesively affixed metal or plastic plate. The foil conductor elements themselves are constructed as follows, for example: an electrically conductive copper layer 6 is adhesively affixed to a base foil 51. A cover foil 52 is situated on copper layer 6 (see FIG. 2). Cover foil 52 is provided with at least one breakout 7 in the area of openings 21 through 25, so that the electrically conductive copper layer is exposed. As an alternative to a single layer foil conductor element, foil conductor elements having multiple layers may also be used.

Base plate 1 may also be designed having one or more openings 2, the corresponding adhesively affixed foil conductor elements 2 and their reinforcing elements 4, depending on the number of inputs and outputs required for the electronic circuit. The spatial position of the openings on base plate 1 is also freely selectable.

An interconnect device having at least one electronic component 9 (electronic module) may now be adhesively affixed to base plate 1. Interconnect device 8 connects electronic components 9 to corresponding contact pads 10. These contact pads 10 are electrically connected to the electrical paths of copper layer 6 in flex foil elements 31 through 35, preferably by wire bonding 11, by contacting the electrical paths in the flex foil elements via breakouts 7. A robust bonding process may be ensured by reinforcing elements 4 beneath the flex foil elements. FIG. 4 shows the corresponding construction stage in which the base plate is completed with the flex foil elements (foil conductor elements) and the electronic circuit. In this construction stage, it is possible to test the complete electronic circuit and its contacts electrically, for example.

In the next manufacturing step, the construction stage shown in FIG. 4 is inserted into a molding tool. This molding tool is outlined in a detail in FIG. 2 and has an upper half 201 and a lower half 202. The module is accommodated at reinforcing elements 4 in particular in tool bottom half 202 (see also FIG. 2, area Wu). The top part of molding tool 201 moves toward base plate 1 and seals the latter in area Wo. Area Wo forms a circumferential sealing line, as shown by dotted line 12 in FIG. 1. The closing force of the molding tool may be supported mutually by opposing areas Wu and Wo. Likewise, the seal on base plate 1 is simple since the base plate offers a planar area having a good surface. Molding compound 13 is poured into closed molding tool 201, 202 in a conventional way and thus forms the housing for the electronic circuit. The tightness of this mold housing is ensured by the fact that molding compound 13 adheres to base plate 1 circumferentially (in parallel with dotted line 12) and the adhesive bond of flex foil strips 3 is tightly sealed around opening 2.

The tightness of the housing may thus be achieved in a much simpler way than with conventional control modules, where each contact strip of the punched screen must have adhesion or tightness on each of the four sides in order to prevent oil from penetrating into the area of the electronics. Since the control units require a large number of contacts (inputs/outputs) on the order of 40 to 80 units, this yields 40 to 80 sealing lines. According to one exemplary embodiment of the present invention, the sealing line to the base plate and one sealing line per opening in the base plate must be sealed in the control unit. It is thus possible to construct, for example, a control unit having five openings (i.e., five foil conductor elements, for example) containing a total of 80 contact paths but nevertheless having only six sealing lines (cf. FIG. 1). It is also advantageous if all sealing lines are planar and are not three-dimensional, as is the case with the punched screen contact strips. The surface area in the area of the sealing lines is also defined and does not fluctuate greatly due to process and material tolerances as is the case with the punched edges in the punched screen contact strips.

Another advantage is that the base plate material may be coordinated precisely with the thermal expansion coefficient of the molding compound since the base plate does not assume any electrical functions. The risk of crack formations due to different thermal expansions is therefore minimized.

Since the position, shape and number of the contact strips in a control unit may have an influence on the molding operation (for example, the molding compound must flow around the contact strips unhindered and unfavorable configurations may result in defects (bubbles), etc.), the molding operation must be adjusted with each change in the punched screen. This entails a process risk and corresponding effort for process development. In the case of a control unit according to one exemplary embodiment of the present invention, the layout of the flex foil elements and the electrically insulated feeder lines in general (which may also be punched screens) is freely creatable without having any influence on the molding operation. Even the configuration of the opening is not critical since the molding compound must seal only along line 12, which is parallel to the base plate. Sealing of the feeder lines is accomplished by adhesive bonding 14 between base plate 1 and cover foil 7 (see FIG. 2).

With the proposed approach using flex foil elements, tool costs required for the flex foil elements are lower than with comparable punched screen designs. If necessary, the change may be limited to only one element. An additional opening in the base plate or a new configuration of an opening is less cost-intensive than with a comparable punched screen approach.

Figure 5:
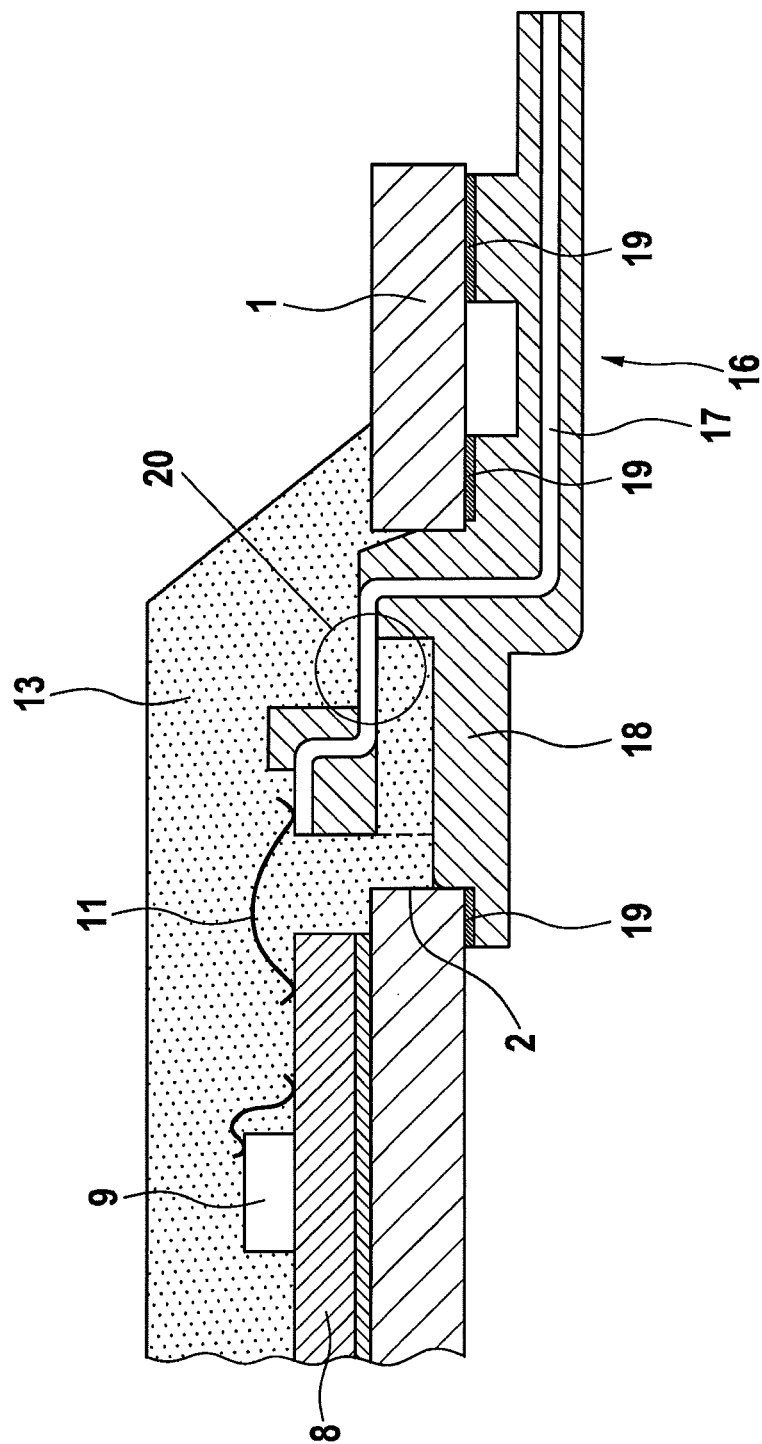
FIG. 5 shows a sectional diagram of a subarea of the control module according to one exemplary embodiment of the present invention.

One advantage of the punched screen technology is a comparatively high current-carrying capacity due to the larger cross sections of the conductors. Therefore, it should be necessary for triggering an electrical oil pump, for example, to be able to connect a few "power lines" to the electrical circuit, so that the control unit may be provided with a punched screen according to FIG. 5. Such punched screens may be provided as an alternative or in addition to foil conductor elements. In this case, a plastic sheathed punched screen part 16 is inserted into an opening 2 in base plate 1. This punched screen part includes at least one printed conductor 17, which is injected into a plastic 18 in a known manner. The punched screen is preferably contacted by wire bonding 11 to interconnect device 8 of the electrical circuit, similar to the foil conductor elements. In the area of opening 2, a subarea 20 of each printed conductor is exposed in such a way that molding compound 13 is able to flow around the printed conductors on all four sides. Penetration of oil through the individual printed conductors is thereby prevented. In the area of openings 2, a tightness is created by adhesive bonding of sheathing 18 to the base plate by molding compound 13. Alternatively, the plastic sheathing may also be affixed tightly directly to the base plate using an adhesive 19.

Another aspect of the present invention involves the mechanical fixation of the control unit in the control module or directly on a transmission part of the automotive transmission. If a control unit is secured on a metallic plate made of aluminum (e.g., the hydraulic control plate of the transmission) in a conventional manner, then substantial strains may occur when the temperature fluctuates accordingly. These strains are much greater than those of the molding compounds, which in turn entail the risk of cracks in the resin. Complex structural approaches are often necessary in this regard to compensate for these strains (e.g., in the form of elastic elements).

According to one aspect of the present invention, base plate 1 of the control module may be designed to be so rigid that the different thermal expansions cannot induce any deformation but instead result only in stresses. In other words, thermal expansions result in applied stresses in the base plate but not stresses in the molding compound, whereby crack formations may be prevented.

The base plate of the control unit (control module) may therefore easily be provided with recesses, which are provided with boreholes 15, for example, to fasten the control unit onto the transmission (see FIG. 1). This permits conduction of heat directly downward through base plate 1.

Conventionally, the contact strips of the punched screen are welded to the control module to contact the latter electrically. Since the electrical joining technique is also accomplished through plastic-sheathed punched screens, strains are transferred from the punched screen of the control module to the contact strips of the control unit punched screen when there are changes in temperature. These strains also in turn result in a risk of cracks/leakage. It is thus necessary to cushion the strains by "soft, elastic" areas in the punched screen. These areas require an additional installation space, which is often a disadvantage. Furthermore, the short circuit protection against metal chips floating around in the transmission oil is often possible in the elastic area only with an additional effort. Suboptimal short-circuit protection is often accepted up to a certain point to limit costs and complexity.

According to the present invention, a simple molding tool having a simple seal may be used. In particular, no free punching operation is necessary after the molding operation. An inexpensive housing which provides a reliable seal of the electrical components is thus manufacturable. A reliable short-circuit protection may thus be provided at the contact point between the mold housing and the control module. Changes/variants in the configuration of the electrical contacting have no effect on the molding operation per se. Changes and variants in the configuration of the electrical contacts may be established with or without minor tool costs since a new punching tool and a new free-punching tool are not needed for the punched screen. Simple fastening of the control module is also possible; this fastening does not introduce any forces into the molding compound and therefore the tightness of the housing is not at risk.

The electrical contacting is accomplished by a flexible contacting which does not introduce any forces into the molding compound and thus does not compromise the tightness. Thus, if lines must be contacted to the control unit for triggering an electrical oil pump, and these lines must carry high currents (magnitude greater than 10 amperes), then a punched screen part may also be used instead of a foil conductor element.

In addition, it should be pointed out that "including" and "having" do not preclude any other elements or steps, and "one" or "a/n" does not preclude a plurality. Furthermore, it should be pointed out that features or steps described with reference to one of the above-described exemplary embodiments may also be used in combination with other features or steps of other exemplary embodiments described above. Reference numerals in the claims are not to be regarded as restrictions.

What is claimed is:

1. A control module for a motor vehicle, the control module comprising:
    a base plate;
    an electrical unit having an electronic module, the electrical unit being situated on a top side of the base plate;
    an electrically insulated electrical feeder line to electrically connect the electronic module to an external electrical component; and
    a protective compound applied to a top side of the base plate tightly covering the electrical unit to provide protection against environmental influences;

wherein the top side of the base plate protrudes beyond the protective compound in a planar extent on the entire circumference of a bottom side of the protective compound, and wherein the base plate has an opening beneath which the electrically insulated feeder line is situated, for a feed-through of an electrical line between the electronic module and the electrically insulated feeder line, and wherein the electrically insulated feeder line is situated on the bottom side of the base plate, and wherein the electrically insulated feeder line is a punched screen having a punched screen part, which is inserted into a second opening in the base plate and provides the electrically insulated electrical feeder line having a high current-carrying capacity.

2. The control module as recited in claim 1, wherein the protective compound is an insulating compound.

3. The control module as recited in claim 1, wherein the protective compound is only on the top side of the base plate and not on a bottom side of the base plate.

4. The control module as recited in claim 1, wherein all electrically insulated feeder lines are mounted on a bottom side of the base plate directed opposite the protective compound.

5. The control module as recited in claim 4, wherein the electrically insulated feeder line is a foil conductor element having a stiffening element beneath the opening on its side opposite the opening.

6. The control module as recited in claim 1, wherein the protective compound seals the opening in the base plate.

7. The control module as recited in claim 1, wherein an interconnect device is adhesively affixed to the base plate.

8. The control module as recited in claim 1, wherein the control module is a control module for an automatic transmission in a motor vehicle.

9. A motor vehicle having a control module, the control module including:
    a base plate;
    an electrical unit having an electronic module, the electrical unit being situated on a top side of the base plate;
    an electrically insulated electrical feeder line to electrically connect the electronic module to an external electrical component; and
    a protective compound applied to a top side of the base plate tightly covering the electrical unit to provide protection against environmental influences;
    wherein the top side of the base plate protrudes beyond the protective compound in a planar extent on the entire circumference of a bottom side of the protective compound, and wherein the base plate has an opening beneath which the electrically insulated feeder line is situated, for a feed-through of an electrical line between the electronic module and the electrically insulated feeder line, and wherein the electrically insulated feeder line is situated on the bottom side of the base plate, and wherein the electrically insulated feeder line is a punched screen having a punched screen part, which is inserted into a second opening in the base plate and provides the electrically insulated electrical feeder line having a high current-carrying capacity.

10. A method for manufacturing a control module, comprising:
    providing a base plate with an electronic module; mounting an electrically insulated electrical feeder line; and
    applying a protective compound, which provides protection against environmental influences on a top side of the base plate to tightly cover the electrical module, wherein the top side of the base plate protrudes beyond the protective compound in a planar extent on the entire circumference of a bottom side of the protective compound;
    wherein the base plate has an opening beneath which the electrically insulated feeder line is situated, for a feed-through of an electrical line between the electronic module and the electrically insulated feeder line, and wherein the electrically insulated feeder line is situated on the bottom side of the base plate, and wherein the electrically insulated feeder line is a punched screen having a punched screen part, which is inserted into a second opening in the base plate and provides the electrically insulated electrical feeder line having a high current-carrying capacity.

11. The method as recited in claim 10, wherein the applying of the protective compound to the top side of the base plate is carried out by using a molding tool including a tool bottom part and a tool top part, the base plate being inserted into the tool bottom part during application of the protective compound and the tool top part being in contact on a top side of the base plate along a circumferential sealing line during the applying of the protective compound.

* * * * *